(12) United States Patent
Toyoshima et al.

(10) Patent No.: US 7,100,275 B2
(45) Date of Patent: Sep. 5, 2006

(54) METHOD OF PRODUCING A MULTI-LAYERED WIRING BOARD

(75) Inventors: Toshiyuki Toyoshima, Tokyo (JP); Satoshi Yanaura, Tokyo (JP); Yasuo Furuhashi, Tokyo (JP); Hirofumi Fujioka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 126 days.

(21) Appl. No.: 10/893,938

(22) Filed: Jul. 20, 2004

(65) Prior Publication Data

US 2005/0003076 A1  Jan. 6, 2005

Related U.S. Application Data

(62) Division of application No. 09/738,855, filed on Dec. 18, 2000, now abandoned.

(30) Foreign Application Priority Data

Mar. 31, 2000  (JP) ............................. 2000-097250

(51) Int. Cl.
*H05K 3/36* (2006.01)

(52) U.S. Cl. ........................... 29/830; 29/825; 29/852; 174/261; 438/637; 438/652

(58) Field of Classification Search ............... 29/830, 29/852; 174/255, 261; 438/637, 652, 672, 438/680, 681, 688

See application file for complete search history.

(56) References Cited

U.S. PATENT DOCUMENTS

| 5,773,546 | A | 6/1998 | Tomlin et al. |
| 5,777,027 | A | 7/1998 | Endo et al. |
| 5,858,620 | A | 1/1999 | Ishibashi et al. |
| 6,378,201 | B1 | 4/2002 | Tsukada et al. |
| 6,434,819 | B1 | 8/2002 | Rokugawa |
| 6,479,900 | B1 | 11/2002 | Shinogi |
| 6,486,058 | B1 | 11/2002 | Chun |
| 6,618,940 | B1 | 9/2003 | Lubert et al. |

FOREIGN PATENT DOCUMENTS

| JP | 6-268377 | 9/1994 |
| JP | 11-54927 | 2/1999 |
| JP | 11-121645 | 4/1999 |

*Primary Examiner*—Carl J. Arbes
(74) *Attorney, Agent, or Firm*—Leydig, Voit & Mayer, Ltd.

(57) ABSTRACT

Method of producing a multi-layered wiring board comprising the steps of subjecting the photosensitive resin to exposure- and development-treatment to form the holes having a predetermined size and shape; depositing and forming the curable resin to the insulating layer having the holes formed therein in such a manner as to bury the holes, and conducting heat-treatment to form the cured thin film of the curable resin on the surface of the insulating layer; and so removing the curable resin as to leave the cured thin film to obtain the via-holes having the reduced opening size by the cured thin film.

6 Claims, 8 Drawing Sheets polyacrylic acid   polyvinyl acetal   polyvinyl pyrrolidone polyethyleneimine   polyethylene oxide styrene-maleic acid copolymer   polyvinylamine resin   polyallylamine oxazoline group-containing
water-soluble resin ureaderivatives alkoxymethylurea N-alkoxyethyleneurea ethyleneurea ethyleneureacarboxylic acid melamine derivatives alkoxymethylmelamine derivatives benzoguanamine glycoluril

METHOD OF PRODUCING A MULTI-LAYERED WIRING BOARD

BACKGROUND OF THE INVENTION

1. Field of the Invention

The present invention relates to a method of producing a multi-layered wiring board and more particularly to the method of producing a multi-layered wiring board by laminating serially conductor layers and insulating layers.

2. Description of the Background Art

A finer pattern and a multi-layered structure have been employed rapidly in printed wiring boards for mounting semiconductor devices as the electronic appliances have become smaller in size and weight and higher in operation speed and function. Via-holes that establish electric conduction between upper and lower circuits at arbitrary positions are not easily formed in multi-layered wiring structures on press laminated boards. For this reason, a build-up system that laminates serially and alternately insulating layers and conductor layers to form a multi-layered wiring board has been employed instead.

The multi-layered wiring board by the build-up system has generally the structure in which via-holes of upper layers and via-holes of lower layers do not overlap with one another. To achieve a higher signal speed, however, a circuit pattern must be as short as possible, and a "via-on-via structure", in which the via-holes of the upper layers are stacked on the via-holes of the lower layers, has drawn an increasing attention.

A process for forming the via-holes is described in the following reference, for example:

"High Density Build-up Technology for Flip Chip Application", Mottoi Asai, p 200, IEMT/IMC Proceedings 1999

This technology uses a photo via-hole process. The conventional formation method of via-on-via by the build-up system will be explained with reference to this technology.

FIG. 6 shows a basic shape of a core substrate 3 for forming the multi-layered wires. A wiring pattern 20a having lines 40 and lands 50 as a first conductor layer is formed beforehand by photolithography or like means on the core substrate 3. In the example shown, a land (via-hole) pitch is 800 μm and a land diameter (LD) is 250 μm. Two lines are extended at 100 μm L/S (line/space) between the lands.

FIG. 8 shows the conventional process for forming via-on-via on the core substrate 3. In the drawing, reference numeral 1 denotes a first insulating layer having a photosensitive negative type resist, for example. Reference numeral 11 denotes an insulating layer pattern formed when the first insulating layer 1 is exposed and developed. Reference numeral 8 denotes a via for holding electric conduction between upper layer lands and lower layer lands. Reference numeral 60 denotes a photo-mask formed by vacuum depositing a metal such as Cr to portions corresponding to lands represented by 50. An arrow 70 represents ultraviolet rays that are used for exposure, and reference numeral 80 denotes a via-hole.

Suffixes a, b, c and d will be used to identify the first, second, third and fourth layers when a member having the same function is formed in a plurality of layers.

In the first step 1, a first insulating layer 1a of the first layer is spin-coated uniformly to a thickness of 5 to 70 μm on the core substrate 3, for example. Pre-baking is then conducted at 70 to 150° C. to evaporate away an excessive solvent contained in the first insulating layer 1a.

In the step 2, ultraviolet rays are irradiated to expose the first insulating layer 1a with a photo-mask 60a. Reaction components such as acids and radicals occur at the portions irradiated by the ultra-violet rays 70a, forming a cross-linked structures.

In the step 3, development is conducted. When the first insulating layer 1a is washed with a developing solution, the portions not irradiated with the ultra-violet rays 70a are dissolved away. In consequence, an insulating layer pattern 11a inclusive of the via-holes 80a is formed.

In the step 4, an electrically conductive resin is buried into each via-hole to form a via 8a. A second layer wiring pattern 20b is formed on this via 8a by a semi-additive process, for example. The semi-additive process is the method of forming an electrolytic plating by applying electroless copper plating to the entire surface, forming a wiring pattern by using a plating resist and growing electroplating on only the wiring portion by using the exposed chemical copper plating film as an electrode.

In the step 5, the first insulating layer 1b as the second layer is formed uniformly by the same method as that, of the step 1, and pre-baking is conducted, when necessary. In the step 6, the ultra-violet rays 70b are irradiated for exposure with the photo-mask 60b in the same way as in the step 2. In the step 7, the first insulating layer 1b as the second layer is developed in the same way as in the step 3, forming the via-holes 80b of the second layer. In the step 8, the electrically conductive resin is buried in the same way as in the step 4 to form a via 8b. Electroless plating and electroplating are carried out serially to complete the wiring pattern 20c of the third layer.

A series of the process steps described above form the via-on-via structure. The size of the via-holes or the lands is the same for each layer, and two lines are formed between the land and the land.

The process described above uses photolithography for forming the via-holes, but it is also possible to form the via-holes in the insulating layer 1 by irradiating an excimer laser or a YAG laser without using the mask.

As the semiconductor devices mounted onto the multi-layered wiring board are required to possess higher functions, the number of input/output pins provided to the semiconductor devices and eventually, the number of lines necessary for a wiring pattern, increases drastically.

The number of lines that can be extended between lands becomes greater when the size of via-holes (or lands) is smaller if the pitch between the via-holes (or the lands) is constant. Therefore, many attempts have been made to reduce the size of the via-holes. The conventional method of forming the via-holes involves the resolution limit of a photolithography process or the restriction by an irradiation diameter of a laser beam spot, and never satisfactorily miniaturize the via-holes. In consequence, a greater number of lamination is required for the multi-layered wiring board and the production cost soars.

SUMMARY OF THE INVENTION

The object of the present invention is to provide a method of producing a multi-layered wiring board with via-holes formed free from the resolution limit of a photolithography process and the restriction by an irradiation diameter of a laser beam spot.

The method of producing a multi-layered wiring board according to the present invention comprises the step of subjecting the photosensitive resin to exposure- and development-treatment to form the holes having a predetermined size and shape, the step of depositing and forming the curable resin to the insulating layer having the holes formed therein in such a manner as to bury the holes, and conducting heat-treatment to form the cured thin film of the curable resin on the surface of the insulating layer, and the step of so removing the curable resin as to leave the cured thin film to acquire the via-holes having the reduced opening size by the cured thin film. Therefore, the method of producing a multi-layered wiring board according to the present invention is capable of controlling the size of the via-holes accurately.

The method of producing a multi-layered wiring board according to the present invention may use an epoxy resin, an epoxy-modified acrylate resin, a cationic polymerization product of an epoxy resin, a phenol resin, a melamine resin, a carboxy-modified epoxy acrylate and a cinnamate, for the photosensitive resin.

The method of producing a multi-layered wiring board according to the present invention may use a water-soluble material such as a water-soluble resin or a water-soluble cross-linking agent for a curable resin.

The method of producing a multi-layered wiring board according to the present invention may use those materials which are soluble in organic solvents, such as a polymethylsiliceous siloxane, a melamine resin, an acrylate resin, an epoxy resin, and so forth, for a curable resin.

By the method of producing a multi-layered wiring board according to the present invention, the reduction degree of the via-hole size of the upper stages is greater than that of the via-hole size of the lower stages. Therefore, the number of lines that are extended between the lands may be increased in the upper stages.

By the method of producing a multi-layered wiring board according to the present invention, the curable resin may contain the particles of calcium carbonate or polybutadiene rubber. Therefore, the adhesion strength of the conductor pattern is improved.

By the method of producing a multi-layered wiring board according to the present invention, the curable resin may contain the rubber particles having the butadiene-acrylonitrile copolymer. Therefore, the adhesion strength of the conductor pattern is improved by the chemical treatment.

DESCRIPTION OF THE PREFERRED EMBODIMENTS

Figure 1:
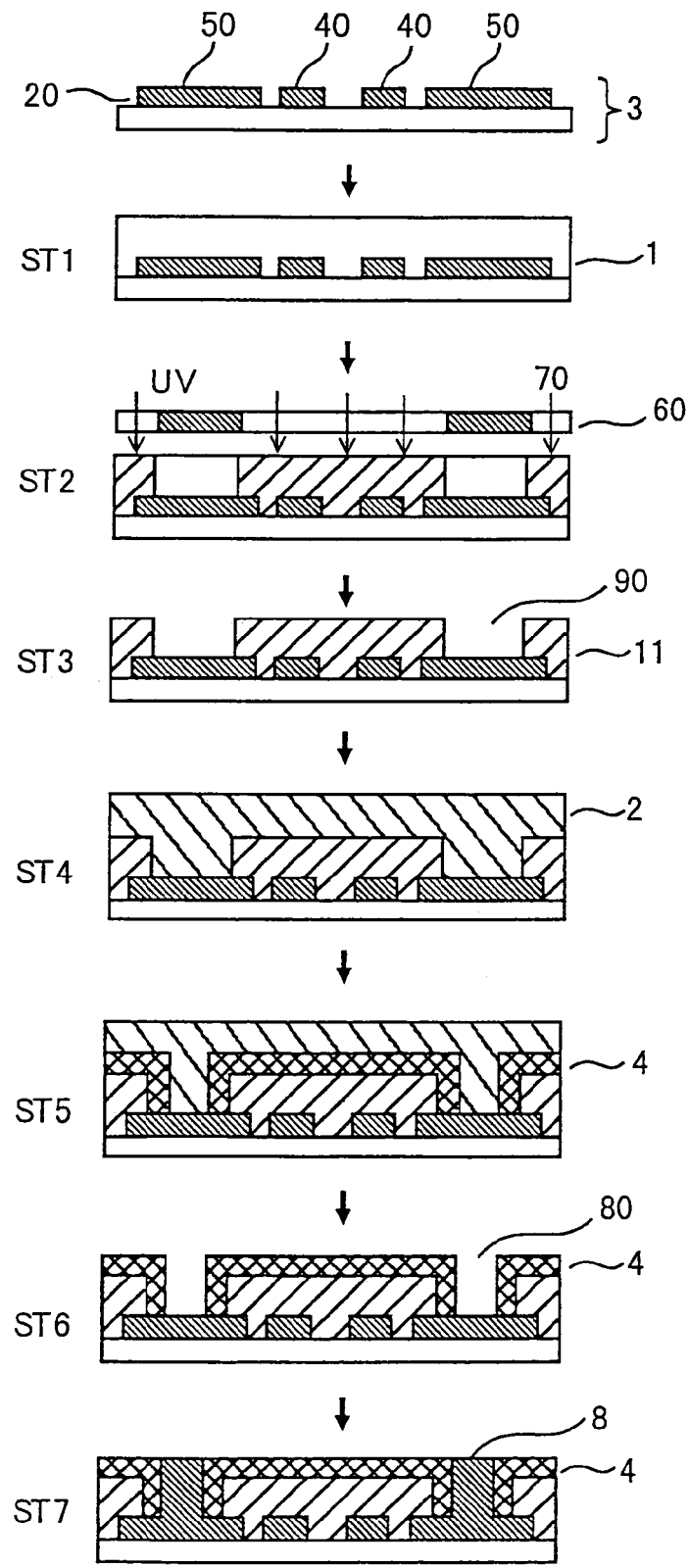
FIG. 1 is a process flowchart useful for explaining a formation method of via-holes the size of which is reduced, according to the present invention.

The present invention will be explained in detail with reference to embodiments thereof shown in the accompanying drawings. FIG. 1 explains the process for forming via-holes having a reduced aperture diameter as the basis of the present invention.

Referring to FIG. 1, reference numeral 1 denotes a first insulating layer made of a photosensitive resin that generates reaction components such as acids and radicals upon irradiation of light. Reference numeral 2 denotes a second insulating layer made of a curable resin that generates the cross-linking reaction with reaction components such as the acids and radicals upon heat-treatment. Reference numeral 3 denotes a core substrate on which a wiring pattern 20 having lands 50 and lines 40 is formed. Reference numeral 4 denotes a cross-linked layer generated as a result of the reaction in the interface between the insulating layer 1 and the insulating layer 2. Reference numeral 11 denotes an insulating pattern that is obtained after the exposure and development of the first insulating layer land on which holes 90 are formed.

In the step 1, the first insulating layer 1 is formed to a uniform thickness of 5 to 70 μm, for example, on the core substrate 3 by means such as spin coating, curtain coating, dip-coating, spray coating, or the like. Heat-treatment (pre-baking) is then carried out at 70 to 150° C. for 1 to 60 minutes to evaporate away an excessive solvent contained in the first insulating layer 1.

In the step 2, ultra-violet rays are irradiated to the first insulating layer 1 with a photo-mask 60 to expose this first insulating layer 1. In this embodiment, the first insulating layer 1 uses a photosensitive negative type resist. Therefore, the reaction components such as acids and radicals occur at the portion irradiated with the ultra-violet rays 70, forming the cross-linked structure.

In the step 3, the first insulating layer 1 is developed. When the first insulating layer 1 is washed with a developing solution, the portions of the insulating layer 1 to which the ultra-violet rays 70 are not irradiated are dissolved away, leaving thereby holes 90. Consequently, an insulating layer pattern 11 is formed, but the reaction components such as acids and radicals remain at the end portions of the insulating layer pattern 11.

The present invention may employ carbon dioxide gas ($CO_2$) laser, YAG laser, excimer laser, etc, for opening the holes because the reaction components such as acids and radicals occur on the irradiated end portions of the insulating layer pattern 11.

In the step 4, the second insulating layer 2 is formed uniformly by the same method as that of the first insulating layer 1. Next, the resulting insulating layer 2 is pre-baked at 85° C. for about 30 minutes, for example, when necessary.

In the step 5, heat-treatment is carried out at a temperature, that does not invite deformation of the insulating layer pattern 11, such as at 85 to 160° C., for example. This heat-treatment diffuses the reaction components such as acids and radicals remaining in the insulating layer pattern 11 into the second insulating layer 2. When diffusion of the acids and the radicals is thus promoted, the cross-linking reaction starts occurring in the interface between the insulating layer pattern 11a and the second insulating layer 2. The heat-treatment time in this case is from 1 to 60 minutes, for example, and varies depending on the kind of the materials used for the insulating layers and depending on the desired thickness of the cross-linked layer.

As a result, the cross-linked layer 4 is formed in the interface between the first insulating layer 1 and the second insulating layer 2 in such a manner as to cover the insulating layer pattern 11. The cross-linked layer 4 is also called the cured resin layer.

In the step 6, washing is conducted. This washing treatment washes away the portions of the second insulating layer 2 that are not cross-linked. A washing solution that dissolves the non-cross-linked portions of the insulating layer 2 but does not dissolve the insulating layer 1 is selected from among pure water, an aqueous solution of organic solvents, tetramethylammonium hydrate (TMAH), alkaline developing solutions such as sodium hydroxide, organic solvents, and so forth. As a result, via-holes 80 are formed.

In the step 7, the conductive resin is applied in such a manner as to bury a conductor in the via-holes 80 and to form the via 8.

The via 8 (and the via-hole 80) formed in this way has a width (diameter) smaller than the size expected by the pattern of the photo-mask 60.

The present invention reduces the size of the via-holes by utilizing the cross-linking reaction occurring between the first insulating layer and the second insulating layer. Therefore, the present invention is free from the resolution limit of the photolithography process and the restriction by the irradiation diameter of the laser beam spot. In other words, the resolution limit in the present invention exceeds drastically the resolution limit of the conventional methods, and via-holes having sizes by far smaller than in the conventional methods can be formed with high accuracy.

The reaction components such as acids and radicals are presumably involved in the cross-linking reaction occurring between the first insulating layer and the second insulating layer. The following references put the description that suggests such a view.

(a) Model of Acid Generation:
"Molecule Design of VLSI Resist", YuzuruTsuda, p58, 1990, Kyoritsu Shuppan Co.

(b) Model of Radical Generation:
"Sensitizer", edited by Katsumi Tokumaru, p154, 1987, Kodansha K. K.

The present invention is not limited to the cross-linking reaction induced by the acids and the radicals. Needless to say, the present invention provides similar effects by other reaction components so long as the reaction utilizes the reaction components due to the incidence of the light and the cross-linking reaction or the setting reaction induced by such reaction components.

Next, concrete materials that may be applied to the first and second insulating layers of the present invention will be explained.

The first insulating layer uses those materials which generate the reaction components such as acids and radicals by the irradiation of light or by a suitable heat-treatment. In the case of photo-resists, the negative type or the positive type can be selected appropriately. The form of the material such as a liquid material or a film does not limit the present invention.

Examples of the materials include a material consisting of an epoxy resin or an epoxy-modified acrylate resin as a principal component, a material utilizing cationic polymerization of an epoxy resin, a material having a phenol resin and a melamine resin, or a material having their mixture. A material having a mixture of a carboxy-modified epoxy acrylate and an epoxy resin, and a material having a cinnamate and an epoxy resin may be also used.

In contrast, the second insulating layer 2 uses those materials which are insolubilized in the developing solution upon heat-treatment in the presence of the cross-linking reaction components such as acids and radicals. A wide variety of materials such as water-soluble resins, water-soluble cross-linking agents, and water-insoluble insulating materials that are soluble in organic solvents are included. Suitable materials can be selected from among them. The form of the material such as the liquid or the film is in no way restricted as in the case of the first insulating layer.

Figure 2:
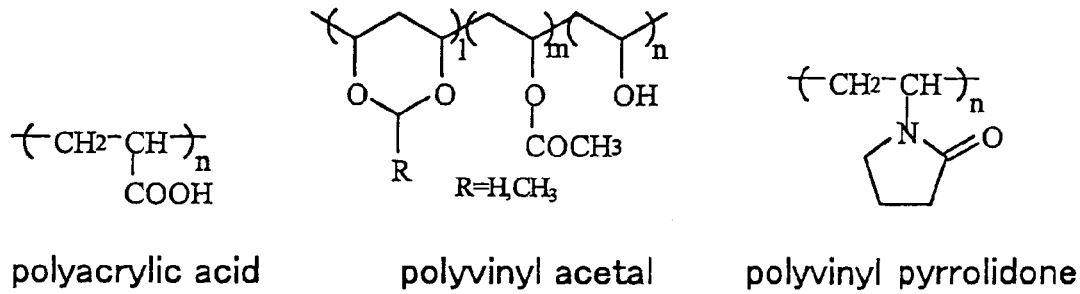
FIG. 2 shows molecular and chemical structural formulae of water-soluble resins used for a second insulating layer in the present invention.
Figure 2:
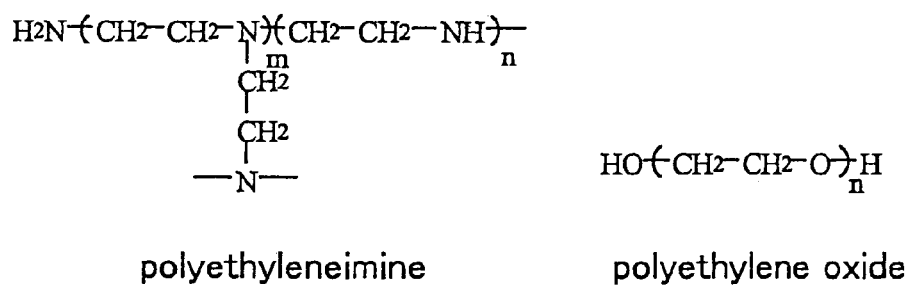
Figure 2:
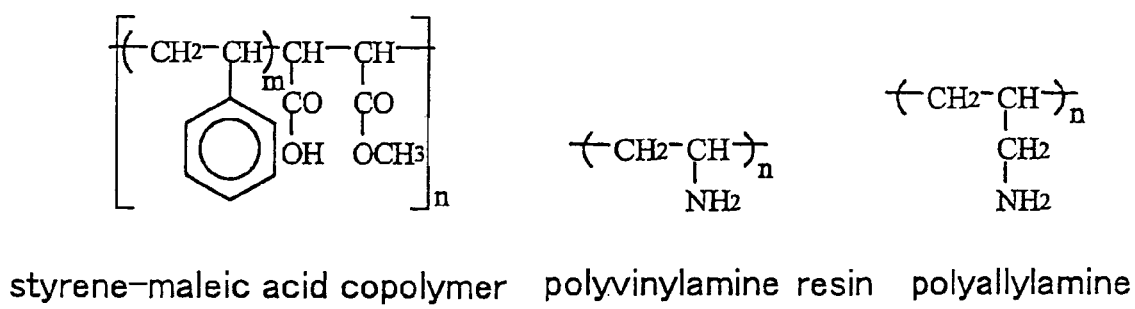
Figure 2:
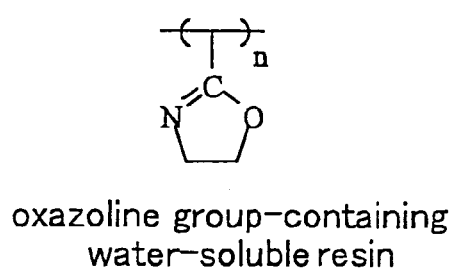

FIG. 2 shows the water-soluble resins that may be used in the present invention. Particularly effective among them are a polyacrylic acid, a polyvinyl acetal, a polyvinyl pyrrolidone, a polyethyleneimine, a polyethylene oxide, a styrene-maleic acid copolymer, a polyvinylamine resin, a polyallylamine, and an oxazoline group-containing water-soluble resin.

Water-soluble melamine resins, water-soluble urea resins, water-soluble alkyd resins and sulfonamide resins may be also used.

These water-soluble resins need not be used alone, and their mixtures may be used appropriately.

Figure 3:
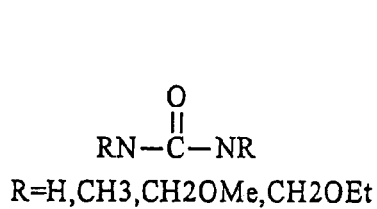
FIG. 3 shows molecular and chemical structural formulae of water-soluble cross-linking materials used for the second insulating layer in the present invention.
Figure 3:
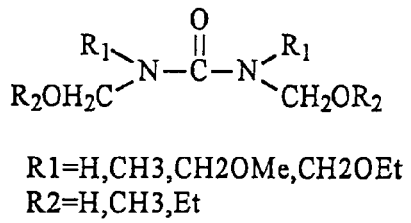
Figure 3:
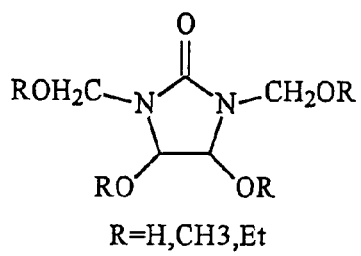
Figure 3:
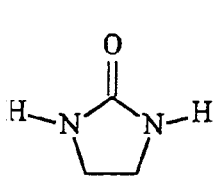
Figure 3:
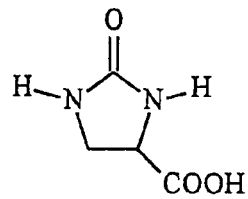
Figure 3:
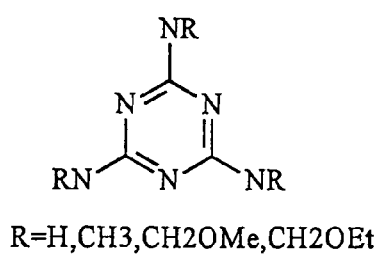
Figure 3:
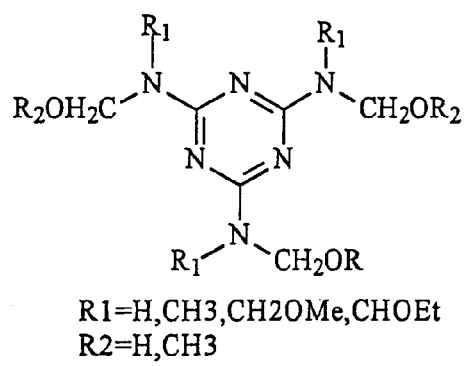
Figure 3:
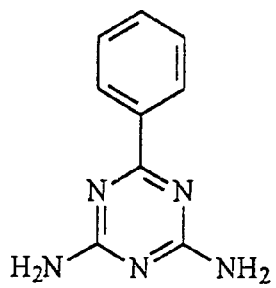
Figure 3:
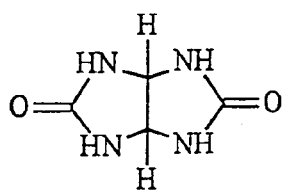

FIG. 3 shows the water-soluble cross-linking agents that can be used in the present invention. They include urea type cross-linking agents such as urea derivatives, alkoxymethylurea, N-alkoxyethyleneurea, ethyleneurea and ethyleneureacarboxylic acid, melamine type cross-linking-agents such as melamine derivatives and alkoxymethylmelamine derivatives, benzoguanamine, glycoluril, and the like. These cross-linking agents are used either alone or as a mixture.

Though the amino type cross-linking agents are illustrated hereby, they are not restrictive, in particular. Those cross-linking agents which generate the cross-linkage with the reaction components of the first insulating layer upon heat-treatment can be used for the present invention.

The present invention can use the water-soluble resin in combination with the water-soluble cross-linking agent in mixture. When used alone, some water-soluble cross-linking agents fail to form a uniform coating film. Therefore, film formation performance is improved when such cross-linking agents are mixed appropriately with the water-soluble resin.

Since their mixture has high water solubility, shelf life can be improved. When the polyvinyl acetal resin as a water-soluble resin composition is mixed with methoxymethylolmelamine or ethyleneurea as the water-soluble cross-linking agent, the mixture can be used stably even after it is preserved for a long time.

Examples of the water-insoluble insulating materials that are soluble in organic solvents and are used for the second insulating layer 2 include polymethylsiliceous siloxane, melamine resins, acrylate resins, epoxy resins, and so forth.

In this case, selection of the solvent for dissolving the second insulating layer is of importance. The solvent is preferably the one that dissolves the second insulating layer but does not dissolve the first insulating layer and allows it to swell appropriately.

Examples of such solvents include xylene, anisole, tetrahydrofuran, N-methylpyrrolidone, γ-butyrolactone, MEK (methyl ethyl ketone), and so forth. These solvents can be used either alone or in mixture.

It is possible to mix inorganic particles such as calcium carbonate or resin particles such as polybutadiene rubber particles with the second insulating layer. It is further possible to first mix butadiene-acrylonitrile copolymer rubber particles to form the insulating layer, and then to conduct chemical etching by an oxidizer containing a mixture of potassium dichromate and sulfuric acid. Because the surface of the insulating layer gets roughened in this way, adhesion with the conductor can be improved.

Next, the method of controlling the cross-linking reaction will be explained. The controlling method includes means that regulates the process condition and means that adjusts the material composition of the second insulating layer 2.

The means (1) that regulates both heat-treatment temperature and treatment time is effective in process condition control. As the treatment time is regulated while the heating temperature is kept constant or as the heating temperature is regulated while the heating time is kept constant, the thickness of the cross-linked layer can be controlled accurately.

From the aspect of the material composition used for the second insulating layer, the means (2) that mixes two suitable kinds of water-soluble resins and regulates the mixing ratio to control the reactivity with the first insulating layer, and the means (3) that mixes a suitable water-soluble cross-linking agent with the water-soluble resin and regulates the mixing ratio to control the reactivity with the first insulating layer, are effective.

The controlling condition of these cross-linking reactions must be determined taking various factors such as those listed below into consideration:

(1) reactivity of the second insulating layer with the first insulating layer;
(2) pattern shape and thickness of the first insulating layer;
(3) required thickness of the cross-linked layer;
(4) exposure condition and heat-treatment condition that can be employed; and
(5) coating condition.

The material composition of the first insulating layer influences particularly the reactivity between the first and second insulating layers. When the present invention is executed in practice, the material of the second insulating layer is optimized preferably in consideration of the factors described above.

Next, a production method of a multi-layered wiring board according to the present invention will be explained with reference to FIG. 4. In the first step 1, a first insulating layer 1a is deposited onto a core substrate 3. In the next step 2, ultra-violet rays 70a are irradiated to the first insulating layer 1a by using a photo-mask 60a. In the step 3, the first insulating layer 1a is developed and a first insulating layer pattern 11a having via-holes 80a is formed.

In the step 4, an electrically conductive resin is applied to bury the holes, and a conductor layer is formed inside each via-hole. A second wiring pattern 20b is then formed by a semi-additive method, for example.

In the step 5, a first insulating layer 1b as the second layer is applied. In the step 6, ultra-violet rays 70b are irradiated by using a photo-mask 60b. Development is conducted in the step 7, forming holes 90b. Non-cross-linked insulating layers are dissolved away, and an insulating layer pattern 11b as the second layer is formed. In the step 8, a second insulating layer 2b as the second layer is applied uniformly.

Heat-treatment is carried out in the step 9 to induce the cross-linking reaction in the second insulating layer 2b in such a manner as to promote diffusion of reaction components from the first insulating layer 1b and cover the first insulating layer 1b. This treatment forms a cross-linked layer 4b that is in solubilized in the developing solution.

In the step 10, development is conducted to dissolve away the non-cross-linked portions of the second insulating layer 2b. This treatment provides via-holes 80b the size of which is reduced.

In the step 11, the electrically conductive resin is applied to bury the holes, and a conductor layer is formed inside each via-hole the size of which is so reduced. Furthermore, a wiring pattern 20c as the third layer is formed by the semi-additive method, for example.

Because the size of the via-hole immediately below the land formed hereby is reduced as described above, the diameter of the land can be made smaller than that of the lower layer even when the overlay accuracy margin of the pattern is the same as that of the second layer. Thus the space between the lands is increased, and the number of lines formed between the lands can be increased. Though two lines are formed in the first and second layers, three lines are formed in the third layer.

In the step 12, a first insulating layer 1c as the third layer is applied. In the next step 13, ultra-violet rays 70c are irradiated by using a photo-mask 60c and the first insulating layer 1c is exposed. In the step 14, the first insulating layer 1c is developed, forming a first insulating layer pattern 11c of the third layer having holes 90c. In the step 15, a second insulating layer 2c of the third layer is applied.

In the step 16, heat-treatment is conducted and a cross-linked layer 4c of the third layer is formed. Heat-treatment in this case uses a higher heating temperature than the heating temperature used for forming the cross-linked layer 4b in the step 9, or a longer heat-treatment time. In consequence, diffusion of the reaction components such as acids and radicals is further promoted, and the film thickness of the cross-linked layer becomes greater. In the step 17, development is conducted and the non-cross-linked second insulating layer 2c is removed. As a result, via-holes 80c the size of which is further reduced are formed.

In the step 18, the holes are buried by using the electrically conductive resin, and a conductor layer is formed inside each reduced via-hole. A wiring pattern 20d of the fourth layer is formed thereon by the semi-additive method, for example.

Since the space between the lands for the wiring pattern 20d is wider than the space for the wiring pattern 20c, the number of lines formed is greater than that of the third-layer.

The explanation given above represents the case where two lines are formed between the lands for the first and second layer, three lines for the third layer and four lines for the fourth layer. However, the number of lines can be decided appropriately in accordance with the Line/Space rule used.

Figure 4:
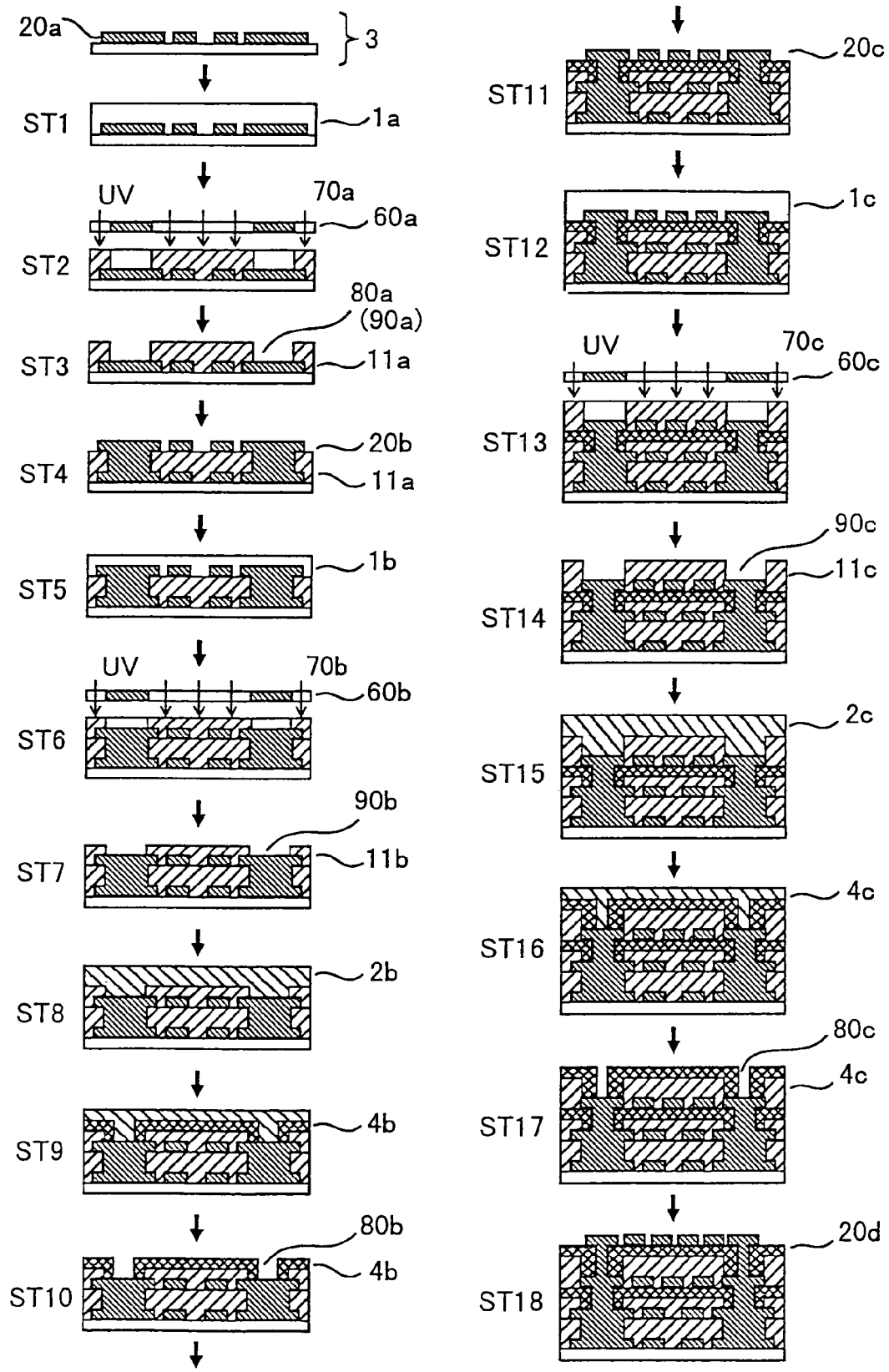
FIG. 4 is a process flowchart useful for explaining a formation method of via-on-via in the present invention.
Figure 8:
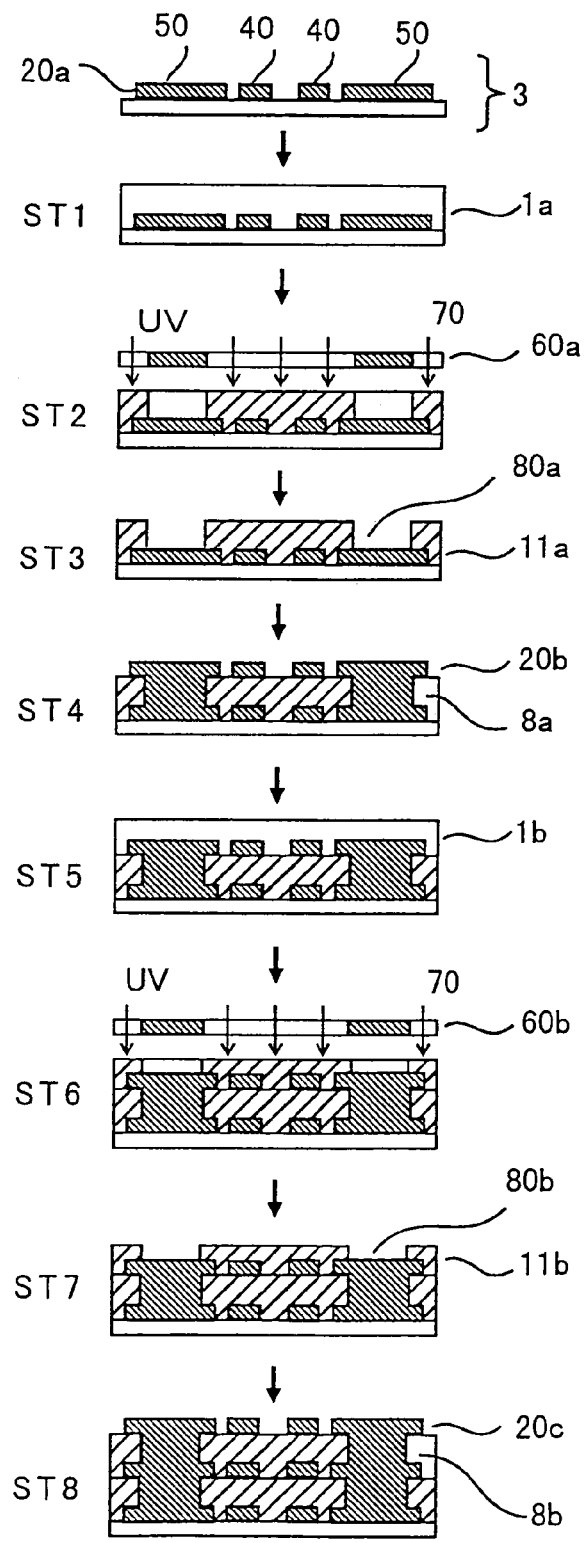
FIG. 8 is a process flowchart useful for explaining a formation method of a via-on-via structure according to the photo via-hole process.

The comparison FIG. 4 with FIG. 8 shows clearly the effects of the present invention. According to the conventional process, only up to six lines can be extended even when the wiring pattern is formed into the multi-layered structure of up to three layers. However, the embodiment of the present invention can form seven lines. If the required number of lines is seven, the conventional process needs to form the fourth layer and invites the increase of the production cost. In addition, the greater becomes the number of layers, the lower becomes reliability of appliances.

If the wiring patterns are to be formed into the four-layered structure, the number of lines is 8 according to the conventional process whereas it is as great as 11 in the present invention. If the number of necessary lines is 11, the conventional process requires forming the sixth layer or in other words, it needs two more layers.

Because the present invention can increase the number of extendable lines, the present invention can decrease the number of layers to be laminated and can improve reliability of appliances.

EXAMPLE 1

This example examined the relationship between the diameters of via-holes and the heat-treatment condition.

(1) Lands and lines were formed by etching on an FR4 substrate (copper foil: 20 μm), a product of Mitsubishi Gas Chemicals Co, giving a core substrate 3. A photosensitive insulating resin, XP9500CC of Shipley Co, utilizing cationic polymerization of an epoxy resin, was applied to the core substrate by a curtain coating method, and was heated and dried at 90° C. for 50 minutes, giving a first insulating layer 1 having a resin film thickness of 50 μm.

Next, ultra-violet rays of 3.0 J/cm² were irradiated from a UV exposure machine (a product of USHIO Denki Co.) in the presence of a photo-mask having a circular pattern having a 150 μm diameter. After heat-treatment was carried out (90 ° C./30 min), development was conducted by using a 1.3 wt % aqueous solution of sodium hydroxide. There was thus obtained a first insulating layer pattern 11 having a via-hole pattern of a 150 μm diameter.

(2) Methoxymethylolmelamine/Cymel 370 (50 g), a product of Mitsui Cyanamide K. K., pure water (180 g) and isopropyl alcohol (20 g) were mixed serially with Eslec KW3 (100 g), a polyvinyl acetal resin of Sekisui Kagaku K. K., and the mixture was stirred at a room temperature for 6 hours. To the resulting solution were added further 15 g of butadiene-acrylonitride copolymers having grain diameters of 5 μm and 1 μm, respectively, and the mixtures were stirred at a room temperature for 6 hours to give a second insulating layer solution.

(3) The second insulating layer solution obtained in the paragraph (2) was applied by the curtain coating method to the core substrate on which the via-hole pattern having a diameter of 150 μm and formed in the paragraph (1) was formed, and was pre-baked at 80° C. for 20 minutes.

Next, the heat-treatment was carried out under the three conditions of 120° C./30 min, 130° C./30 min and 140° C./30 min, respectively, to diffuse the reaction components from the first insulating layer and to allow the cross-linking reaction to proceed. Furthermore, pure water spray development was conducted and non-cross-linked portions in the second insulating layer were removed (at a spray pressure of 2 Kg/cm²).

Table 1 illustrates the diameters of the via-holes formed by these operations. The diameter was smaller than 150 μm in all cases, and heat-treatment temperature dependence could be observed among the hole diameters so obtained. In other words, when the treating time was kept fixed at 30 minutes, the hole diameters became progressively smaller with a higher heat-treatment temperature.

(4) The substrate was immersed into, and swayed inside, an aqueous chromic acid ($CrO_3$) 500 g/L solution adjusted to 50° C. for 15 minutes to examine the surface roughening effect. The substrate was then immersed in a neutralizing agent, OM950 of Shipley Co., and was washed with water.

A copper paste, CPC-8000 of Sumitomo Bakelite Co, as an electrically conductive resin, was buried into the via-patterns to form a via-conductor layer. A 20 μm-thick Cu layer was formed by the semi-additive method and its peel strength (90° peel) was measured. The measurement value of the peel strength was 950 g/cm. It was thus confirmed that sufficient peel strength was accomplished.

EXAMPLE 2

This example is another example that examined the relationship between the diameters of via-holes and the heat-treatment condition.

(1) A photosensitive insulating film material, KS22 of JSR Co, was applied as the second insulating layer by the curtain coating method to the core substrate having the via-hole pattern of a 150 μm diameter and obtained in the paragraph (1) of Example 1, and was pre-baked at 90° C. for 30 minutes.

Next, the heat-treatment was carried out under the conditions of 110° C./10 min, 110° C./20 min, 110° C./30 min and 135° C./40 min, respectively, to diffuse the reaction components and to allow the cross-linking reaction to proceed. Pure water spray development was then conducted, and non-cross-linked portions were removed (at a spray pressure of 2 Kg/cm²).

(2) Table 2 illustrates the diameters of the via-holes obtained at this time. The diameter was smaller than 150 μm in all cases, and heat-treatment time dependence was observed among the resulting hole diameters. In other words, when the treatment temperature was kept fixed at 110° C., the hole diameter became smaller as the treatment time became longer.

(3) This substrate was immersed into, and swayed inside, a chromic acid aqueous solution 500 g/L adjusted to 50° C. for 15 minutes, and was immersed in a neutralizing agent, OM950 of Shipley Co. and washed with water.

A copper paste, CPC-8000 of Sumitomo Bakelite K. K., was buried into the via-pattern to form a via-conductor. A 20 μm-thick Cu layer was then formed by the semi-additive method and its peel strength (90° peel) was measured. The measurement value was 950 g/cm. It was thus confirmed that sufficient peel strength was accomplished.

EXAMPLE 3

This example is still another example that examined the relationship between the diameters of via-holes and the heat-treatment condition.

(1) A photosensitive insulating material, Probelec XB7081 of Ciba Guigy, was applied to a substrate, FR4 of Mitsubishi Gas Chemical K.K. Exposure, heat-treatment and development were then carried out under the manufacturer's recommended condition to form via-holes having a diameter of 150 μm. A photosensitive inter-layer insulating material, XP9500CC of Shipley Co. was then applied by the curtain coating method, and was pre-baked at 90° C. for 30 minutes.

Next, heat-treatment was carried out under the conditions of 110° C./15 min, 120° C./15 min, 130° C./15 min and 135° C./20 min, respectively, to diffuse the radical components from the insulating layer pattern-and to allow the cross-linking reaction to proceed in the interface. Furthermore, pure water spray development was conducted to remove the non-cross-linked portions (at a spray pressure of 2 Kg/cm²).

(2) Table 3 illustrates the via-hole diameters obtained at this time together with the heat-treatment conditions. The via-hole diameters were smaller than 150 μm in all cases, and heat-treatment temperature dependence was observed among the resulting hole diameters. In other words, when the treatment time was kept constant, the via-hole diameters became smaller when the treatment temperature was higher.

(3) The substrate was immersed into, and swayed inside, a chromic acid 500 g/L aqueous solution adjusted to 50° C.

for 15 minutes, was then immersed in a neutralizing agent, OM950 of Shipley Co, and was thereafter washed with water.

A copper paste, CPC-8000 of Sumitomo Bakelite K. K., was buried into the via-pattern. A 20 μm-thick Cu layer was formed by the semi-additive method, and its peel strength (90° peel) was measured. The measurement value was 950 g/cm. It was thus confirmed that sufficient peel strength was accomplished.

EXAMPLE 4

The example that formed a build-up type multi-layered wiring having four layers of wiring patterns by using the materials and the process of Example 2 is shown. However, a 1% aqueous solution of NaOH was used in place of pure water spray for developing the second insulating layer.

Figure 5:
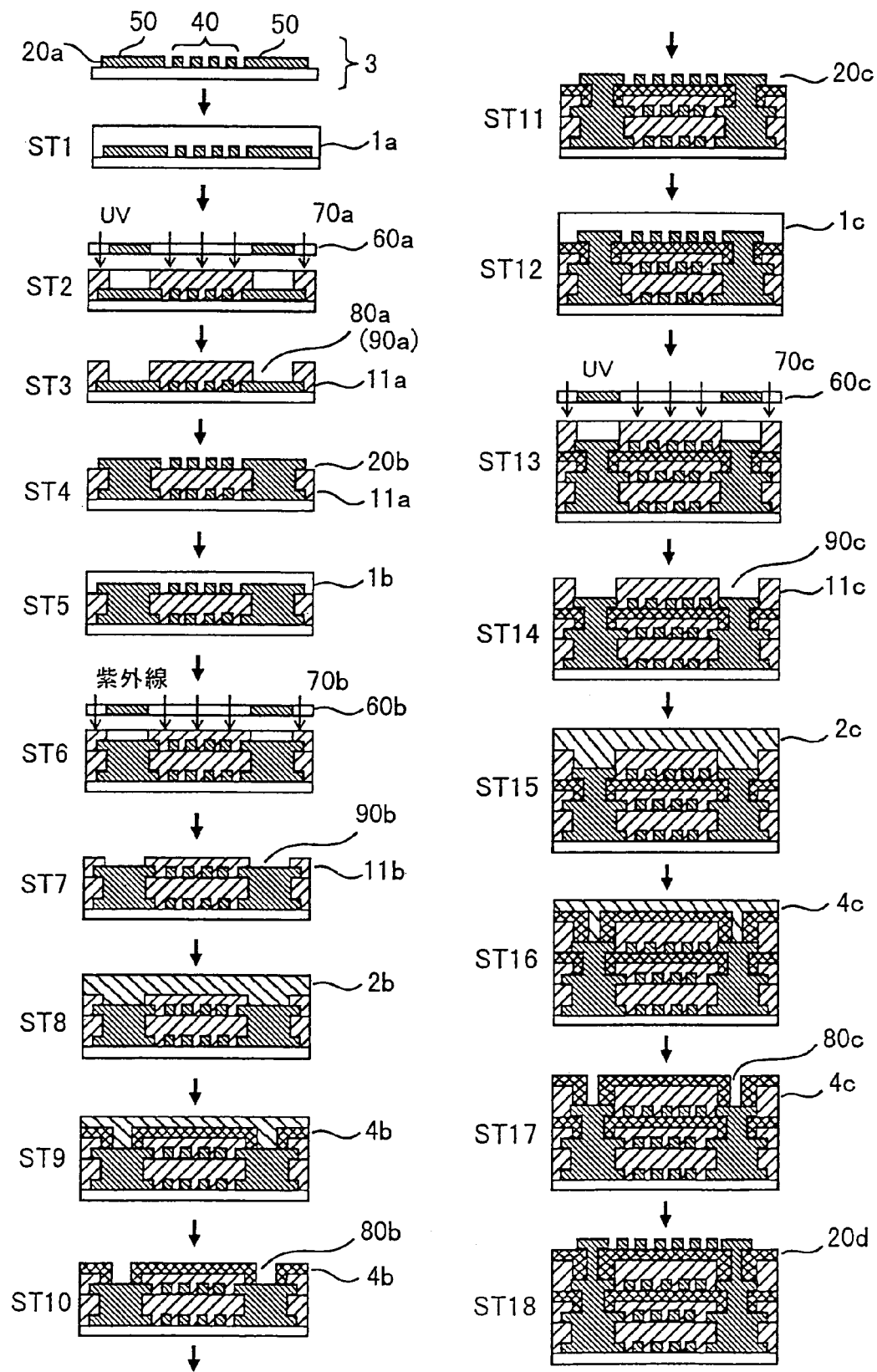
FIG. 5 is a process flowchart useful for explaining a formation method of the multi-layered wiring board used in Example 6.
Figure 6:
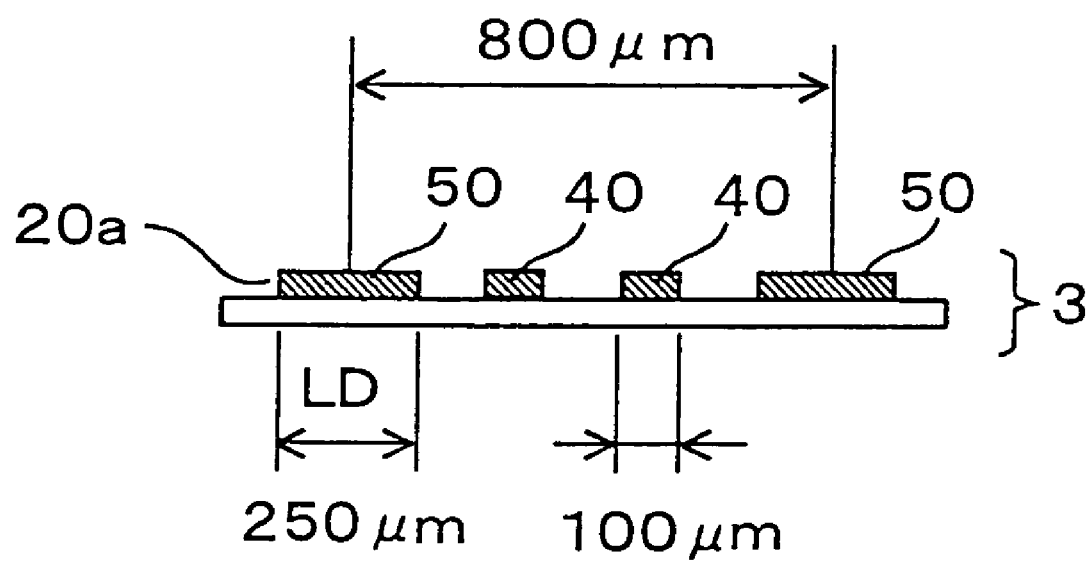
FIG. 6 shows the basic shape of a core substrate.

(1) FIG. 5 shows the process flow. This process was fundamentally the same as the one shown in FIG. 4, and the following description was directed to only the main points.

The core substrate had four lines of 50 μm L/S formed between the lands with a via-hole pitch of 800 μm.

In the step 4, the overlay accuracy margin of a pattern was assumed as 100 μm with respect to the via-holes having a diameter of 150 μm, and the land diameter was therefore set to 250 μm. Since the space between the lands became 550 μm in this case, four lines were formed at 50 μm L/S between the lands.

(2) The second insulating layer 2b as the second layer was heat-treated at 110° C. for 20 minutes. After development was conducted, the aperture diameter of the via-holes was reduced to 100 μm. The overlay accuracy margin of the land diameter of the third layer was assumed as 100 μm in the same way as the wiring pattern of the second layer, and was set to 200 μm. Since the via-hole diameter was reduced and the space between the lands became greater to 600 μm, five lines could be formed between the lands at 50 μm L/S.

The second insulating layer 2c of the third layer was heat-treated at 135° C. for 40 minutes. After development was conducted, the via-holes were reduced to 40 μm. The overlay accuracy margin was assumed as 100 μm, and the land diameter of the third layer was set to 140 μm. Since the space between the lands became greater to 660 μm, six lines could be formed between the lands at 50 μm L/S.

EXAMPLE 5

Figure 7:
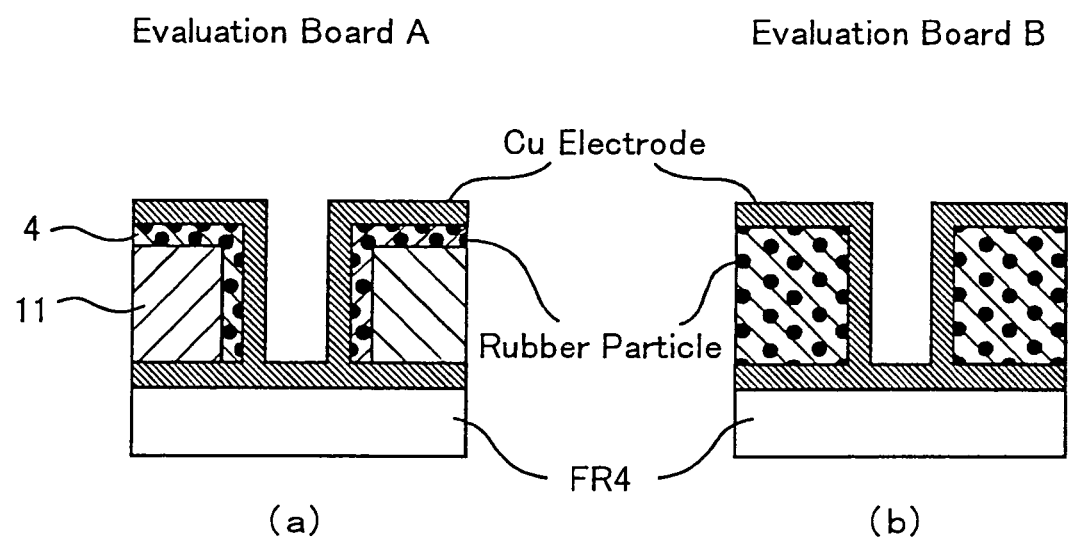
FIG. 7 shows sectional structures of Evaluation Boards A and B whose electric properties, and the like, are measured.

This example shows the influences of the rubber particles used for surface roughening on the dielectric constant, the heat expansion coefficient and the peel strength of the insulating material. FIG. 7(a) and (b) illustrate the sectional structures of the boards used for evaluation.

(1) 120 g of a 50% acrylate of a cresol novolak epoxy resin (Epicoat 180, a product of Yuka Shell K. K.), 80 g of bis-phenol A epoxy resin (E1001, a product of Yuka Shell K. K.), 30 g of diaryl terephthalate; 6 g of Irgacure 907 (a product of Ciba Guigy Co.) and 100 g of butyl cellosolve were mixed serially, and the mixture was stirred at a room temperature for 3 hours to give a first insulation layer solution A.

A first insulating layer solution A was prepared afresh, and 15 g each of butadiene-acrylonitrile copolymers having grain diameters of 5 μm and 1 μm were mixed, respectively. The mixtures were stirred at a room temperature for 3 hours to give a first insulating layer solution B containing the rubber particle components.

(2) 50 g of a polyvinyl acetal resin (Eslec KW3, a product of Sekisui Kagaku K. K.), 150 g of ethyleneurea (MX280, a product of Sanwa Chemical K. K.), 280 g of pure water and 20 g of isopropyl alcohol were serially mixed. The mixture was stirred at a room temperature for 2 hours. To this solution were added 15 g each of butadiene-acrylonitrile copolymers having grain diameters of 5 μm and 1 μm, respectively, and the mixture was stirred at a room temperature for 6 hours to give a second insulating layer solution.

(3) The first insulating layer solution A was applied by the curtain coating method to three FR4 substrates (copper foil: 20 μm) of Mitsubishi Gas Chemicals K. K. Each substrate was heated and dried at 80° C. for 30 minutes to form a first insulating layer having a film thickness of 50 μm. Ultra-violet rays of 1.5 J/cm$^2$ were irradiated to each substrate from a UV exposure machine (a product of USHIO Denki K. K.) by using a mask with a circular pattern having a diameter of 100 μm. After heat-treatment (90° C./30 min), each substrate was developed. Irradiation of the ultra-violet rays was again conducted at 1.5 J/cm$^2$ from the UV exposure machine to obtain an insulating layer having a hole pattern of a diameter of 100 μm (Board A-1).

(4) The second insulating layer solution was applied by the curtain coating method, and each substrate was pre-baked at 80° C. for 20 minutes. The three FR4 substrates were heat-treated under different heat-treatment conditions (120° C./30 min, 130° C./30 min and 140° C./30 min) so that the cross-linking reaction proceeded in the interface between the first and second insulating layers. Each substrate was washed with pure water spray development (spray pressure=1.2 kg/cm$^2$) to remove non-cross-linked portions in the insulating layer, and a cross-linked layer 4 was formed on the first insulating layer 11.

(5) Table 4 illustrates the examination result of the relationship between the heat-treatment condition and the via-hole diameter. It could be confirmed that the higher the heat-treatment temperature, the smaller became the via-hole diameter. Among the samples, the substrate having a hole pattern of a 90 μm diameter was called A-2 and was used for preparing an evaluation sample.

(6) For comparison, an insulating layer having a hole pattern of a 100 μm diameter was formed from the first insulating layer solution B on an FR4 substrate (copper foil: 20 μm), a product of Mitsubishi Gas Chemicals K. K., in the same way as the formation method of the Board A-1. However, the ultraviolet rays were irradiated at 2.0 J/cm, and the resulting substrate was called the Board A-3.

(7) The Board A-2 and the Board A-3 were immersed into, and swayed inside, a chromic acid (CrO$_3$) 500 g/L aqueous solution adjusted to 50° C., for 15 minutes. After these boards were immersed in a neutralizing agent, OM950 of Shipley Co, they were washed with water. Furthermore, electroless plating and electroplating were carried out to form Cu having a film thickness of 20 μm, giving the Evaluation Board A (see FIG. 7(a)) and the Evaluation Board B (see FIG. 7(b)).

(8) The dielectric constant (25° C., 1 kHz) of the insulating layer, the thermal expansion coefficient (80° C. to 120° C.) in the vertical direction and the peel strength (90° peel) of these Evaluation Boards A and B were measured. Table 5 shows the measurement results.

The Evaluation Board A, that contained the rubber particles in only the second insulating layer showed smaller dielectric constant and thermal expansion coefficient than the Evaluation Board B, that contained the rubber particles in all the first insulating layer and both of boards had sufficient peel strengths. It was confirmed that the Evaluation Board A had superior characteristics in dielectric constant and thermal expansion coefficient.

TABLE 1

| Condition | Diameter of Via-Hole |
|---|---|
| Non Heat Treatment | 150 μm |
| 120° C./60 min | 130 μm |
| 130° C./30 min | 100 μm |
| 140° C./30 min | 70 μm |

TABLE 2

| Condition | Diameter of Via-Hole |
|---|---|
| Non Heat Treatment | 150 μm |
| 110° C./10 min | 120 μm |
| 110° C./20 min | 100 μm |
| 110° C./30 min | 80 μm |
| 135° C./40 min | 40 μm |

TABLE 3

| Condition | Diameter of Via-Hole |
|---|---|
| Non Heat Treatment | 150 μm |
| 110° C./15 min | 120 μm |
| 120° C./15 min | 100 μm |
| 130° C./15 min | 80 μm |
| 135° C./20 min | 45 μm |

TABLE 4

| Condition | Diameter of Via-Hole |
|---|---|
| Non Heat Treatment | 100 μm |
| 120° C./30 min | 96 μm |
| 130° C./30 min | 90 μm |
| 140° C./30 min | 83 μm |

TABLE 5

| Sample | Dielectric Constant [1 kHz 20° C.] | Thermal Expansion [Vertical 80~120° C.] | Peel Strength [90° Peel 25° C.] |
|---|---|---|---|
| Evaluation Board A | 4.5 | 40 ppm | 980 kg/cm |
| Evaluation Board B | 4.8 | 55 ppm | 970 kg/cm |

What is claimed is:

1. A method of producing a multi-layered wiring board comprising:

forming an insulating layer of a photosensitive resin on a substrate, and exposing and developing said insulating layer to form holes having respective sizes in said insulating layer;

depositing a curable resin member selected from the group consisting of polymethylsiliceous siloxane, a melamine resin, an acrylate resin, and an epoxy resin, and containing particles of one of calcium carbonate and polybutadiene rubber, onto said insulating layer having the holes and filling the holes;

heating said curable resin to form a cured thin film from only a part of said curable resin, at an interface of said insulating layer and said curable resin, leaving a part of said curable resin uncured;

removing the part of said curable resin that is uncured, but not said cured thin film, leaving via-holes where the holes were made in said insulating layer, the via-holes being smaller in size than the holes due to said cured thin film remaining in the holes on said insulating film; and filling the via-holes with an electrically conductive material, thereby forming vias.

2. The method of producing a multi-layered wiring board according to claim 1, wherein said photosensitive resin is at least one member selected from the group consisting of an epoxy resin, an epoxy-modified acrylate resin, a cationic polymerization product of an epoxy resin, a phenol resin, a melamine resin, a carboxy-modified epoxy acrylate, and a cinnamate.

3. The method of producing a multi-layered wiring board including a plurality of stages of via-holes formed by repeating the process of claim 1, wherein the via-holes of later-formed stages are smaller in size than the via-holes of earlier formed stages.

4. A method of producing a multi-layered wiring board comprising:

forming an insulating layer of a photosensitive resin on a substrate, and exposing and developing said insulating layer to form holes having respective sizes in said insulating layer;

depositing a curable resin member, selected from the group consisting of a water-soluble resin and a water-soluble cross-linking agent, and containing particles of one of calcium carbonate and polybutadiene rubber, onto said insulating layer having the holes and filling the holes;

heating said curable resin to form a cured thin film from only a part of said curable resin, at an interface of said insulating layer and said curable resin, leaving a part of said curable resin uncured;

removing the part of said curable resin that is uncured, but not said cured thin film, leaving via-holes where the holes were made in said insulating layer, the via-holes being smaller in size than the holes due to said cured thin film remaining in the holes on said insulating film; and filling the via-holes with an electrically conductive material, thereby forming vias.

5. The method of producing a multi-layered wiring board according to claim 4, wherein said photosensitive resin is at least one member selected from the group consisting of an epoxy resin, an epoxy-modified acrylate resin, a cationic polymerization product of an epoxy resin, a phenol resin, a melamine resin, a carboxy-modified epoxy acrylate, and a cinnamate.

6. The method of producing a multi-layered wiring board including a plurality of stages of via-holes formed by repeating the process of claim 4, wherein the via-holes of later-formed stages are smaller in size than the via-holes of earlier formed stages.

* * * * *